(12) United States Patent
Arnold

(10) Patent No.: US 8,184,746 B2
(45) Date of Patent: May 22, 2012

(54) SIMPLIFIED DE-ROTATION IN DIGITAL FM DEMODULATOR ARCHITECTURES

(75) Inventor: Siegfried H. Arnold, St. Ruprecht A.D. Raab (AT)

(73) Assignee: NXP B.V., Eindhoven (NL)

( * ) Notice: Subject to any disclaimer, the term of this patent is extended or adjusted under 35 U.S.C. 154(b) by 720 days.

(21) Appl. No.: 11/994,787

(22) PCT Filed: Jul. 3, 2006

(86) PCT No.: PCT/IB2006/052223
§ 371 (c)(1),
(2), (4) Date: Oct. 24, 2008

(87) PCT Pub. No.: WO2007/004187
PCT Pub. Date: Jan. 11, 2007

(65) Prior Publication Data
US 2009/0103655 A1   Apr. 23, 2009

(30) Foreign Application Priority Data
Jul. 4, 2005   (EP) .................................... 05106040

(51) Int. Cl.
*H04L 27/14* (2006.01)
*H03D 3/00* (2006.01)

(52) U.S. Cl. ........................................ 375/322; 329/315

(58) Field of Classification Search .......... 375/271–272, 375/274, 279, 322–323, 334–335; 455/205, 455/142; 329/315, 318, 323
See application file for complete search history.

(56) References Cited

U.S. PATENT DOCUMENTS

| | | | |
|---|---|---|---|
| 3,091,735 A | 5/1963 | Moore | |
| 4,090,145 A * | 5/1978 | Webb | 329/323 |
| 4,675,882 A * | 6/1987 | Lillie et al. | 375/324 |
| 5,052,050 A | 9/1991 | Collier et al. | |
| 5,230,011 A * | 7/1993 | Gielis et al. | 375/344 |
| 5,386,239 A * | 1/1995 | Wang et al. | 348/472 |
| 5,550,869 A * | 8/1996 | Gurantz et al. | 375/340 |
| 5,742,637 A * | 4/1998 | Kanterakis et al. | 375/147 |
| 5,859,607 A * | 1/1999 | Leeuwenburgh et al. | 341/155 |
| 5,875,213 A * | 2/1999 | Asami et al. | 375/336 |
| 5,940,863 A | 8/1999 | Fimoff et al. | |
| 6,075,410 A * | 6/2000 | Wildhagen | 329/318 |
| 6,192,089 B1 * | 2/2001 | Corleto et al. | 375/344 |
| 6,996,164 B1 * | 2/2006 | Blount et al. | 375/219 |
| 7,738,616 B2 | 6/2010 | Markman | |
| 2003/0174016 A1 | 9/2003 | Meyer | |

FOREIGN PATENT DOCUMENTS

| | | |
|---|---|---|
| CN | 1228176 A | 9/1999 |
| CN | 1518820 A | 8/2004 |
| EP | 0333266 A2 | 9/1989 |

OTHER PUBLICATIONS

Andraka, R Ed—Association for Computing Machinery: "Survey of Cordic Algorithms for FPGA Based Computers" ACMSIGDA International Symposium on Field Programmable Gate Arrays. FPGA '98. ACM, US, vol. 6th Conference, Feb. 22, 1998, pp. 191-200.

* cited by examiner

*Primary Examiner* — Khanh C Tran

(57) ABSTRACT

The present invention relates to a digital receiver for FM signals, in particular to a new demodulator structure and demodulating method, by which according to a first aspect of the invention the usual complex de-rotation process is reduced to a simple addition/subtraction. According to a second aspect of the invention, the requirements for the sampling frequency necessary for processing the demodulator signals are reduced substantially.

16 Claims, 4 Drawing Sheets

SIMPLIFIED DE-ROTATION IN DIGITAL FM DEMODULATOR ARCHITECTURES

The present invention relates to a FM-Demodulator structure according to claim 1, a demodulating method for angle-modulated signals according to claim 9, a receiving device according to claim 11, and a computer program product according to claim 12.

In particular, the present invention relates to a demodulator structure and method by which realization of de-rotation can be simplified and by which less computational efforts are required, if implemented in digital circuitry.

There are many different FM demodulator architectures in the state-of-the art, which are implemented in digital processing (DSP) hardware or time-discrete signal processing hardware. Each of the different approaches has certain advantages as well as drawbacks when compared to the others. However, since there are so many different applications focusing on different aspects, each of these architectures has found its way into its specific application.

There are low cost variants, which are easy to implement, but require a relatively high post-filtering effort in order to suppress self-generated noise. When post-filtering effort is limited, for keeping overall cost low, performance with respect to noise is poor. On the other hand, there are variants, which obtain good performance, because they do not generate internal noise. Most of these demodulation systems work as superheterodyn receivers, which carry out a frequency conversion of the received signal to an intermediate frequency IF. This frequency conversion may be carried out such that at the same time Quadrature signals are generated from the received signal to achieve effective suppression of mirror frequencies. Then, for conversion of the Quadrature intermediate frequency signals into the base band, a process called "de-rotation" is required. By the de-rotation process the spectrum of the intermediate signal is brought closer to zero intermediate frequency (IF) before the actual demodulation tales place. In other words, the de-rotation process is to shift the spectrum by the value of the intermediate frequency IF to the left, that is a shift of the spectrum by the frequency value −IF. In digital receivers, this de-rotation is expensive with respect to the necessary computational effort.

FIG. 1 shows an example for an FM-demodulator architecture of the prior art as part of an FM-receiver 100 that comprises an antenna 110 coupled with a receiver front end section 120 coupled with the FM-demodulator section 130. Such an FM-receiver 100 may be implemented in discrete circuitry as well as an integrated circuitry.

In accordance with the illustrated FM-receiver 100 of the prior art in FIG. 1, the FM-receiver 100 is a Quadrature receiver. That is, a signal is received by antenna 110 and then split into two channels, which are an In-phase (I) channel, i.e. I-channel I, and a Quadrature (Q) channel, i.e. Q-channel Q. Each channel I, Q includes a respective mixer unit in a mixing block 121 for down-conversion of the received signal to the intermediate frequency (IF) by mixing with a mixing frequency LO of a local oscillator, wherein the used mixing frequencies in the I- and Q-channel I, Q have a phase shift to each other of $\pi/2$, i.e. 90°. After the mixing block 121, the channel signals are bandpass filtered in a filter block 123 comprising respective low-IF-filter units. The low-IF-filtered channel signals in the I- and Q-channel I, Q are then input to the FM-demodulator section 130. It is worth noting that the composed I- and Q-signals may be considered as a complex signal.

In the FM-demodulator section 130 the envelope of the channel signals is made constant by a limiting block 131 comprising respective limiter units in each of the channels I and Q. The limiting block 131 is followed by a de-rotation block 133 having respective de-rotation units, e.g. realized by mixers, in each channel. The de-rotation is processed as multiplication of the complex Quadrature signal (composed of the I- and Q-channel signals) by a so-called complex tone, which has the mathematical form according to following equation (1) and is also called a phasor.

$$r(t)=e^{-j\cdot 2\pi\cdot f_r\cdot t} \tag{1}$$

As mentioned above, the purpose of the de-rotation is to shift the spectrum of the intermediate signal along the frequency axis by −fr. In the context of the FM-demodulator architecture in FIG. 1 the de-rotation is used to shift in each of both channels I and Q the low IF signals to zero IF, which makes it more suitable for the actual demodulation of the FM signal. After the de-rotation block 133 there is a harmonics filter block 135 with respective harmonics filter units for filtering the harmonics in the channel signals caused by the limiting block 131.

In the following, the operation of the FM demodulator in the FM-receiver 100 of FIG. 1 will be explained. For that purpose, FIG. 2 illustrates a block diagram of the demodulator section 130 of FIG. 1 in a slightly different manner. Compared to FIG. 1, FIG. 2 shows only the part after the low-IF channel filter 123. However, this is the part, which is relevant for the actual FM-demodulation process. It is worth noting that up to the input of a coordinate rotation digital computer (CORDIC) block 137 or 237, respectively, all signals are complex-valued. CORDIC is a term for shift-add algorithms for computing a wide range of functions including certain trigonometric, hyperbolic, linear, and logarithmic functions. Further information on CORDIC can be gathered from "A survey of CORDIC algorithms for xFPGA based computers" by Ray Andraka, FPGA 1998, proceedings of the 1998 ACM/SIGDA Sixth International Symposium on Field Programmable Gate Arrays, Feb. 22-24, Monterey, Calif. After the CORDIC block 137 or 237 the signal path is real-valued.

The actual FM-demodulation is achieved by the CORDIC block 137 and a subsequent differentiator block 139. At this point, attention is drawn to the aspect that the demodulation should be done at the lowest possible sampling rate in order to save computation resources as well as to save power. The widely known standard interpretation of Shannon's Theorem, avoidance of aliasing requires the spectrum of interest to be within −fs/2 and +fs/2 before processing the spectrum at a sampling rate of fs. That is digital processing the I- and Q-Signals in the CORDIC block 137 requires a high sampling frequency and thus, needs powerful digital signal processors having high power consumption.

Now reference is made to FIG. 2, which contains a more detailed view about how the actual frequency demodulation is achieved by the FM-receiver 100 of the prior art. The intermediate frequency signal $IF_{in}$ output by the receiver front end section 120 is limited by the limiting block 231 and input as limited signal c into the de-rotation block 233. The de-rotated and filtered low-IF signal fd is fed into the CORDIC block 237, which delivers a time-varying phase signal $\phi$ from the filtered low-IF signal fd. Then the time-varying phase signal $\phi$ is differentiated by the differentiator block 239 to convert the carried time-varying phase information to a time-varying frequency information. Finally, as output signal the time-varying frequency signal $\omega_{out}$ is delivered, this completes the demodulation process.

FIG. 5 illustrates the function of the FM-receiver 100 of FIG. 1 by way of sequences of spectra A to D, which give a spectral view of the processed signals. The spectra have been generated with a system sampling frequency of 64 MHz, an IF frequency of 300 kHz, an FM frequency deviation of ±5 kHz and a 5 kbit/s, NRZ data modulation signal. Accordingly, the diagram A of FIG. 5 shows the intermediate frequency spectrum at the input of limiter block 131 or 231, respectively. In diagram B the harmonics of the intermediate frequency spectrum caused by the limiter block 131 or 231 appear. In diagram C the spectrum at the output of the de-rotation block 133 or 233, respectively, is. The spectrum is already shifted to zero IF. Further, in diagram C is depicted the required filter characteristic F1 for the harmonics filter 135 or 235, respectively. The harmonics filter 135 or 235, respectively, are configured such that only the fundamental wave of the zero IF signal including the sidebands, which are approximately 0 Hz±15 kHz, may pass, but all harmonics of the IF signal, the first of which appears at ±1,2 MHz in the example, are rejected. Diagram D of FIG. 5 shows the de-rotated and filtered IF signal, i.e. the base band signal.

In the following a brief look at the effort for de-rotation will be given. First of all, a complex oscillator is needed which produces the complex tone r(t) of equation (1). Since the output sequence of the oscillator is known in advance, the complex oscillator may be implemented as a lookup table, e.g. a read only memory (ROM). Then the respective I- and Q-channel signals have to be multiplied by the complex tone r(t). In other words, a complex multiplication has to be carried out, which requires four real multiplications, one real addition, and one real subtraction according to equation (2).

$$z_1 \cdot z_2 = (x_1 + j \cdot y_1) \cdot (x_2 + j \cdot y_2) = x_1 \cdot x_2 - y_1 \cdot y_2 + j \cdot (x_1 \cdot y_2 + x_2 \cdot y_1) \quad (2)$$

Though the multiplication with the imaginary unit j and the addition of the real part as well as the imaginary part need not to be implemented, due to the fact that the real part and the imaginary part of complex signals are kept in the two separate channels, i.e. the real part in the I-channel and the imaginary part in the Q-channel, nevertheless computation effort is high, in particular in the light of the usual used high sampling frequency.

It is therefore an object of the present invention to provide an improved demodulator structure and respective demodulating method, in particular for angle-modulated signals, which uses at least partly digital signal processing and in which the computational effort for de-rotation and/or demodulation is reduced compared to the prior art.

It is another object of the present invention to provide an improved demodulator structure and respective demodulating method, in particular for angle-modulated signals, which uses at least partly digital signal processing and which allows a significant reduction in the required sampling rate for the FM demodulation.

At least one of the objectives is achieved by a demodulator for angle-modulated signals, structured according to claim 1. Accordingly, a demodulator for angle-modulated signals, comprises means for demodulation of an input intermediate angle-modulated signal, and means for de-rotation of said intermediate angle-modulated signal, wherein said means for de-rotation are placed after said demodulation means and are configured such that de-rotation consists of an addition or subtraction operation.

Further, at least one of the objectives is achieved by a demodulating method, in particular for angle-modulated signals, according to claim 9. Accordingly, a method for demodulating an intermediate angle-modulated signal comprises at least the steps of:

Converting said intermediate angle-modulated signal to an instantaneous phase signal;

Differentiating said instantaneous phase signal to an instantaneous frequency signal; and de-rotating said instantaneous frequency signal by subtraction of a value corresponding to a center frequency of said intermediate angle-modulated signal.

Furthermore, at least one of the objectives is achieved by a receiving device according to claim 11, Accordingly, an FM receiver for receiving frequency modulated signals, which is at least implemented partly in digital circuitry, comprises a demodulator for angle-modulated signals according to the present invention.

In addition, at least one of the objectives is achieved by a computer program product according to claim 12. Accordingly, a computer program product comprises code means readable by a digital computer, wherein said code means are coded such that when run on said digital computer, said computer is configured such that to perform a method for demodulating a angle-modulated signal according to the method of the present invention.

The general idea of the present invention resides in two basic aspects. According to the first aspect, the necessary computation for de-rotation is shifted along the signal path and transformed accordingly such that de-rotation is processed at a point, where de-rotation can be implemented with much less computational effort. Nevertheless, the same result is achieved as in the prior art. In other words, by the invention all the computational effort in the prior art is replaced with a single real subtraction. The second aspect is related to a more exact implementation of Shannon's Theorem by which additional computation resources are saved to a great extent.

The invention will be more completely understood in consideration of the following detailed description of embodiments of the invention in connection with the accompanying drawing. It is noted that reference numbers comprise three digits of which the most important digit is used as reference to the respective drawing figure, e.g. differentiator 139 is present in FIG. 1.

Figure 1:
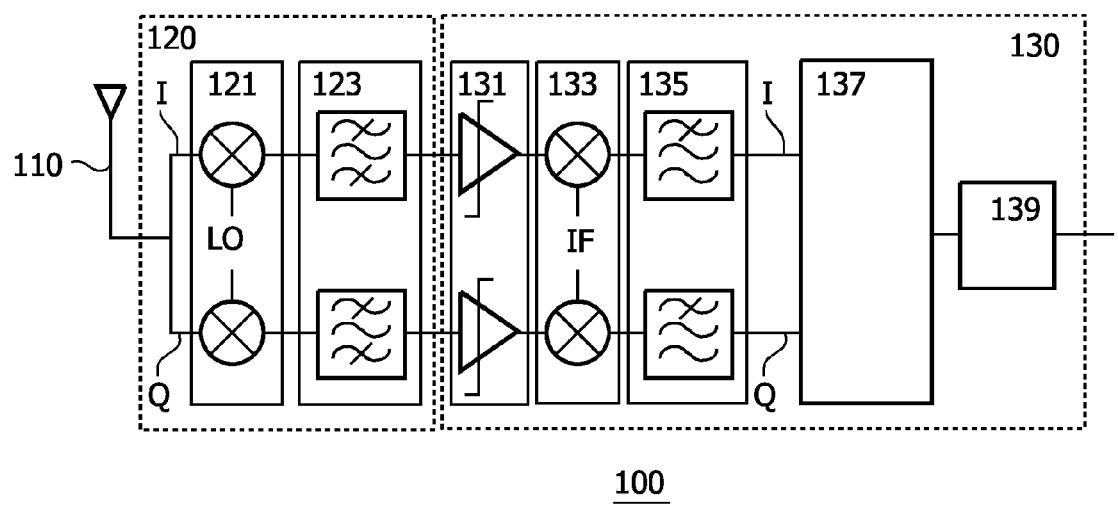
FIG. 1 shows a FM-demodulator structure according to the prior art.

According to the preferred embodiment of the invention, the invented method may be implemented by means of digital circuitry, preferably by means of DSP hardware. While the invention is amendable to various modifications and alternative forms, specifics thereof are shown by way of example in the drawings and are described in detail. However, it should be understood that the intention is not to limit the invention to the particular embodiments described. In particular, whilst the invention is described by reference to a certain FM-demodulator circuit in which the de-rotation according to the present invention is implemented, it goes without saying that the presented concept for de-rotation can be used in several other demodulator circuits providing the same advantages. The same applies for the features regarding the reduced sampling-rate in the actual FM-demodulation. Therefore, the intention is to cover all modifications, equivalents, and alternatives falling within the scope of the invention as defined by the appended claims. In addition, it is noted that appearances of the phrases "in one embodiment" or "in an embodiment" in various places throughout the description are not necessarily all referring to the same embodiment. Furthermore, the particular features and structures or characteristics may be combined in any suitable manner in one or more embodiments.

According to the first aspect of present invention, the harmonics filtering is done differently in comparison to the prior art. Advantageously, the demodulator is simplified by moving the harmonics filter closer to the limiter output. To be more precise: the harmonics filter is not simply moved. Instead, it is replaced by a different harmonics filter, which does a comparable job when directly placed after the limiter. The resulting block diagram is shown in FIG. 3 according to a first embodiment of the present invention and FIG. 4 according to the preferred embodiment of the present invention.

Figure 2:
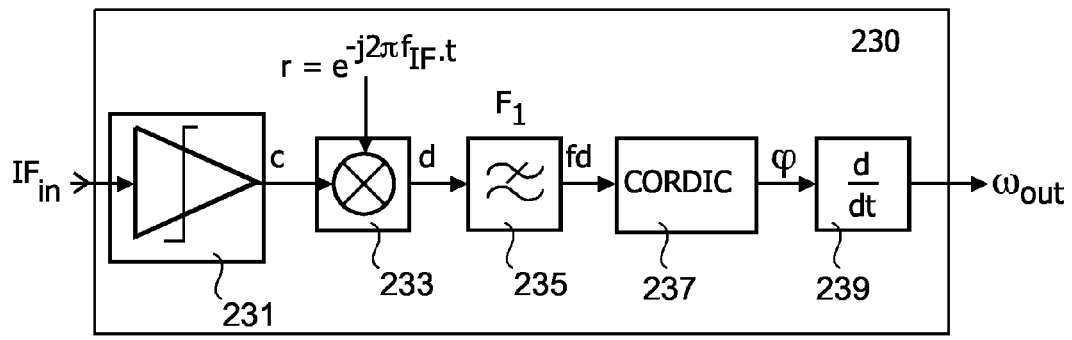
FIG. 2 depicts by way of a schematically block diagram the structure of the FM-demodulator section according to the prior art.

Both filters, the original harmonics filter 135 or 235, respectively, and the new harmonics filter 335 or 435, respectively, are low passes. Both have the task to pass only the main components of the limiter's output spectrum, i.e. the main lobe. However, by having the harmonics filter 335 or 435, respectively, at a better position in the system, according to the present invention the de-rotation process can be dramatically simplified. For explanation of the invention, in the following it will be shown that the block diagrams of FIG. 2 to 4 are mathematically equivalent. That is, the demodulator structures of the invention achieve the same results, but with less effort, regarding required computation as well as implementation.

Figure 3:
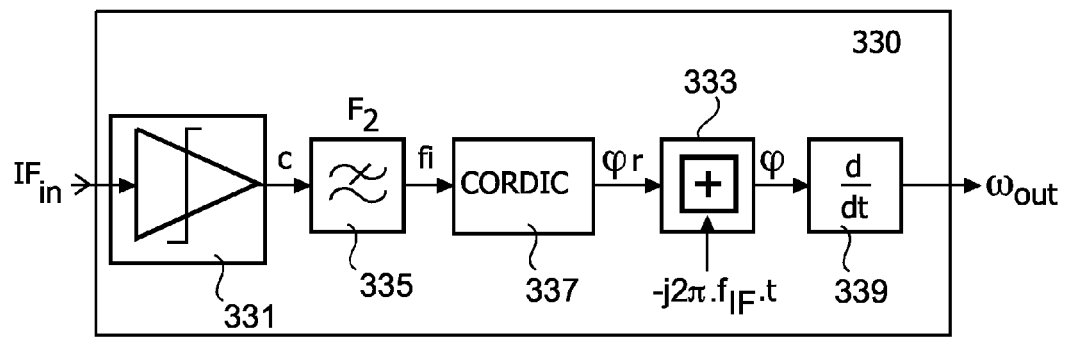
FIG. 3 depicts by way of a schematically block diagram a first improved structure of the FM-demodulator section according to the present invention.
Figure 4:
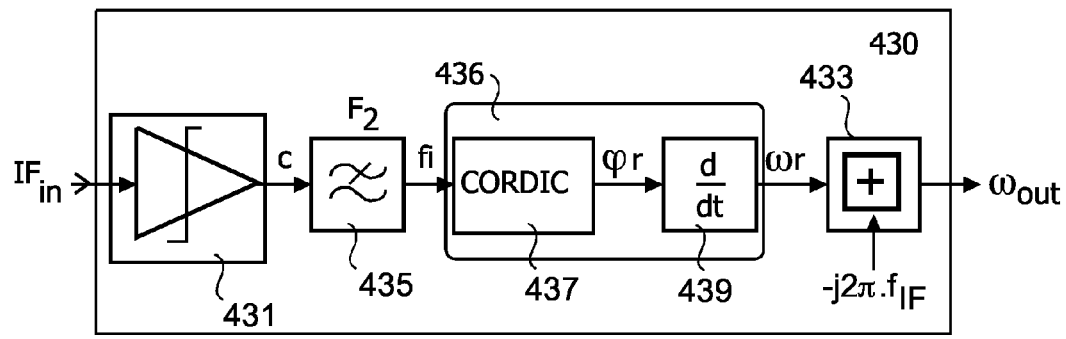
FIG. 4 depicts by way of a schematically block diagram the preferred structure of the FM-demodulator according to the present invention.

In FIG. 3, according to one embodiment of the invention, the filtered IF signal fi is directly feed into the CORDIC block 337, which delivers the instantaneous phase signal φr of the filtered IF signal fi as output. It is worth noting that φr carries the same (modulation) information as φ. The mere difference between φr and φ is that φr has a term $(2\pi \cdot f_{IF} \cdot t)$ superimposed. Since this term is deterministic, i.e. known it in advance, it does not carry any additional information. Thus, by simply subtracting a value of $(2\pi \cdot f_{IF} \cdot t)$ or adding a value of $(-2\pi \cdot f_{IF} \cdot t)$, respectively, to the instantaneous phase signal φr the time-varying phase signal φ can be derived.

Now reference is made to FIG. 4, which shows the structure of a FM-demodulator section 430 according to a preferred embodiment of the invention. For sake of brevity, only the differences to the structure of FIG. 3 will be explained. In FIG. 4, the instantaneous phase signal φr is directly feed into the differentiator block 439 outputting the instantaneous angular frequency ωr of the IF signal. Now, it is possible to simply subtract the center IF frequency, i.e. the value $(2\pi \cdot f_{IF})$, to get the pure modulation frequency $\omega_{out}$ as output. The CORDIC block 437 together with the differentiator block 439 forms the actual means for demodulation of the intermediate angle-modulated signal, which may be a demodulation processor 436 implemented by an applicable programmed DSP. It goes without saying that also the de-rotation block can be implemented within this demodulation processor 436. As a result, the whole de-rotation process, which consisted previously of the generation of a rotating complex phasor and a complex multiplication, is reduced to a single real subtraction according to the present invention.

Figure 5:
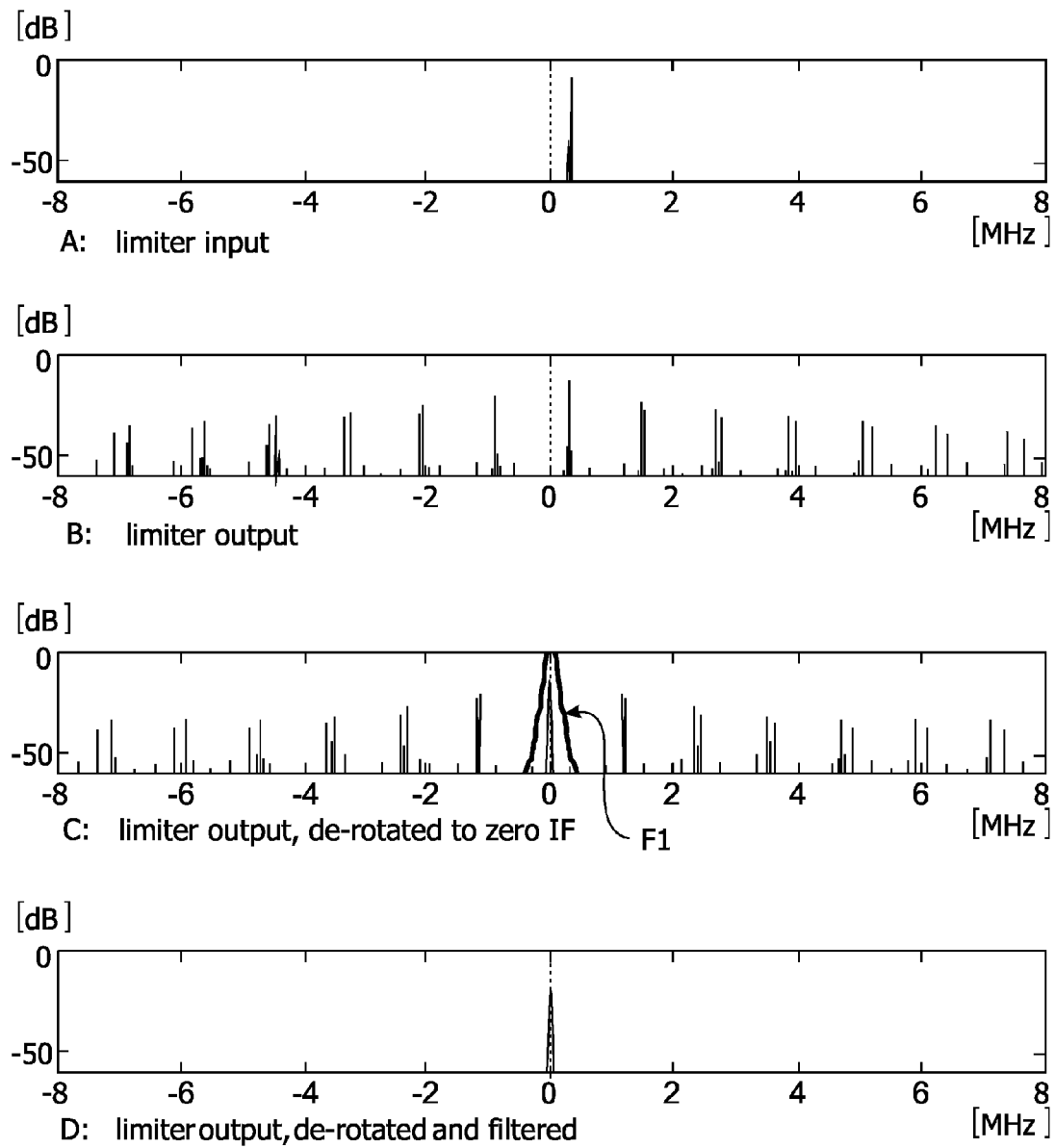
FIG. 5 illustrates diagrams of frequency spectra of certain locations within the FM-demodulator of FIG. 1.
Figure 6:
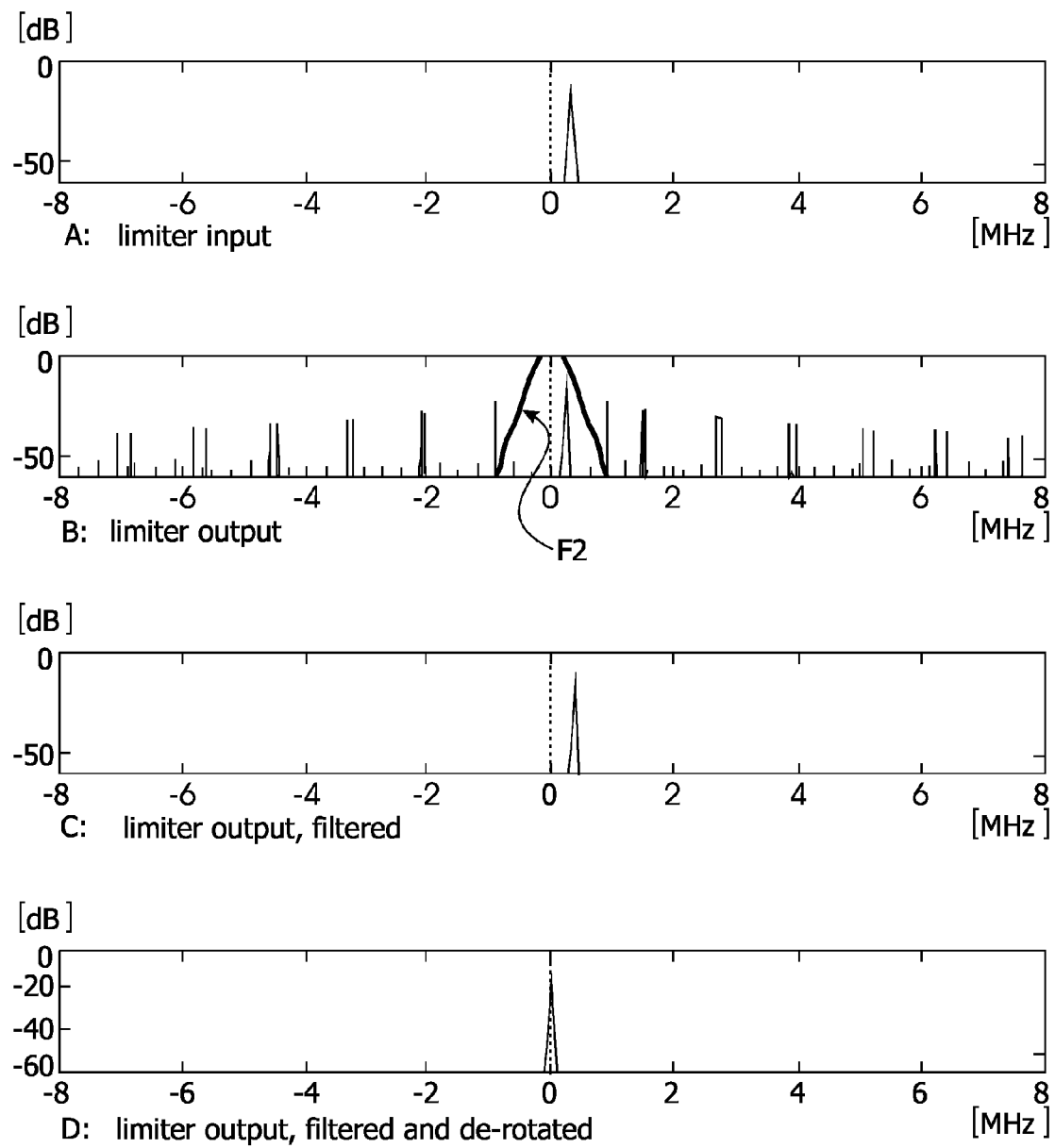
FIG. 6 illustrates diagrams of frequency spectra of certain locations within the FM-demodulator of FIG. 4 according to the present invention.

Now with reference to FIG. 6, the operation of the FM-demodulator of the invention is demonstrated by sequences of spectra. It is noted that without any limitation, the following discussion using certain specification values is provided as example to support better understanding of the invention. Therefore, it goes without saying that the present invention may be implemented with different specification. In detail, FIG. 6 gives a spectral view of the signals in the system of FIG. 1 modified in accordance to FIG. 4 of the present invention, that is section 130 of FIG. 1 is replaced by section 430 of FIG. 4 wherein in FIG. 4 only the position of the several functional blocks is depicted. It is assumed that the same input as discussed together with FIG. 5 above is processed, i.e. sampling frequency of 64 MHz, an IF frequency of 300 kHz, an FM frequency deviation of ±5 kHz and a 5 kbit/s, NRZ data modulation signal.

Accordingly, the diagram A of FIG. 6 shows the intermediate frequency spectrum at the input of limiter block 431. In diagram B the harmonics of the intermediate frequency spectrum caused by the limiter block 431 are present. Further, the required filter characteristic for the harmonics filter 435 is depicted, which is to pass only the fundamental wave of the IF signal including the sidebands, which are approximately 300 kHz±15 kHz, but to reject all harmonics of the IF signal, the first of which appears at −900 kHz in the example. As comparison, in the prior art FM-receiver 100 according to FIG. 1 and FIG. 2, the requirement of the harmonics filter 135 and 235, respectively, was to pass the baseband, i.e. both sidebands with approximately ±15 kHz, and to reject all derotated IF harmonics, the nearest of which appear at ±1.2 MHz (see also diagram B of FIG. 5). Diagram C of FIG. 6 shows the filtered IF signal and diagram D the de-rotated signal. If the effort for implementing the harmonics filter 335 or 435, respectively, were much higher than building the original harmonics filter 135 and 235, respectively, the advantages of the proposed demodulator and respective demodulation method would be (partly) countervailed. For that reason, the implementation effort for both harmonics filters 135 and 235, respectively, as well as 335 or 435, respectively, will be compared in the following discussion.

The original filter 135 and 235, respectively, may have a relatively low order. In the example discussed in the introduction part above, a 5th order Butterworth low-pass has been used. However, since the cut-off frequency is lower, i.e. 100 kHz, than the cut-off frequency, i.e. 400 kHz, of harmonics filter 335 or 435, respectively, filter 135 and 235, respectively, needs a finer resolution, i.e. more bits in the digital implementation. In this connection it is worth to be noted that the larger the ratio between sampling frequency and cut-off frequency becomes, the more resolution is needed in filter implementation to achieve the same overall accuracy, i.e. noise reduction. The harmonics filter 335 or 435, respectively, used in the FM-demodulator of the invention a slightly higher order is needed, i.e. more filter taps and more registers for a digital implementation. For instance, in the present example an 8th order Butterworth low-pass filter has been used. However, since the cut-off frequency is larger than the cut-off frequency of harmonics filter 135 and 235, respectively, the harmonics filter 335 or 435, respectively, needs lesser bits for each register. Therefore, the implementation effort for both filters is overall similar.

However, doing the filtering before the de-rotation block 333 or 433, respectively, provides additional advantage. Because harmonics filter 335 or 435, respectively, removes all IF harmonics before the de-rotation block 333 or 433, respectively, the de-rotation process can already be carried out using a much lower sampling rate. An obvious guess for this sampling frequency would be a bit more than twice the upper band edge of the IF signal, i.e. 700 kHz. However, by evaluating Shannon's theorem more carefully the inventor found out that the sampling frequency can still be much lower, e.g. 60 kHz, without violating Shannon's law. This will be explained herein below in greater detail.

First of all, when considering the process of equidistantly sampling an analog signal in the spectral domain, the spectrum of the sampled signal is made from the original analog spectrum by repeating it with a period of fs, i.e. the sampling rate. Therefore, every frequency in the sampled signal's spectrum can be considered modulo fs.

Accordingly, the Shannon Theorem says that the original analog signal can be recovered if and only if the sampling frequency is chosen such that in the periodic spectrum of the sampled signal two images do not overlap, which is known as aliasing. If the analog signal is a real-valued baseband signal ranging from (close to) 0 Hz up to a maximum frequency $f_{max}$, then the Theorem may be reduced such that the sampling frequency has to be chosen larger than twice $f_{max}$.

However, the filtered IF signal fi (FIGS. 3 and 4), whose spectrum is displayed in the bottom graph of FIG. 6, is neither a real valued signal nor a baseband signal. It is a complex signal which is centered in frequency around $f_{IF}$ and which has a bandwidth stemming from the FM modulation, i.e. determined by the frequency deviation and the modulation index. According to a second aspect of the present invention, the sampling rate fs can be made almost as small as the bandwidth of the signal. With respect to the continued example, this is about 30 kHz, which is advantageously by far smaller than the sampling frequency at the input $IF_{in}$, which is in the example 64 MHz. Thus, the exact sampling frequency depends on what is defined as the actual bandwidth of the signal of interest. Conversely speaking: it depends on which parts of the IF signal may be neglected.

The following mathematical derivation demonstrates how undersampling according to the second aspect of the invention works well together with modulo arithmetic. Firstly, the notion frequency is discussed in the context of a time discrete FM demodulator. It is noted that it does not make much sense to think of a frequency at specific sampling times. Instead, it makes sense to think about the average frequency of a signal during the respective last sampling interval. In order to process information only once per sampling interval, the average frequency of each sampling interval is assigned to its ending time.

Following equation (3) defines the average frequency accordingly:

$$\bar{\omega}(n \cdot T_s) := \frac{\varphi(n \cdot T_s) - \varphi((n-1) \cdot T_s)}{T_s} \quad (3)$$

wherein:
$\bar{\omega}$ is the average angular frequency in a particular sampling interval;
n is the sampling index for that interval;
Ts is the sampling interval duration;
$\phi$(n Ts) it the phase of the signal at the ending of the sampling interval; and
$\phi$((n−1) Ts) is phase of the signal at the beginning of the sampling interval.

Further, the instantaneous modulation frequency (the interval averages) is denoted with the symbol $\omega_m$ and the instantaneous phase of the modulation is denoted with $\omega_m$. Then, $\omega_m$ and $\omega_m$ are related by equation (4).

$$\bar{\omega}_m(n \cdot T_s) := \frac{\varphi_m(n \cdot T_s) - \varphi_m((n-1) \cdot T_s)}{T_s} \quad (4)$$

It is obvious that the frequency change due to the modulation is smaller than the sampling frequency; otherwise, the bandwidth of the modulated IF signal would be larger than the sampling frequency violating Shannon's Theorem. This is reflected by relation (5).

$$\omega_{lo} \leq \bar{\omega}_m < \omega_{lo} + \omega_s \quad (5)$$

wherein:
$\omega_{lo}$ is the lower limit of the modulation frequency range;
$\omega_s$ is the angular sampling frequency; and
$\omega_{lo} + \omega_s$ is the upper limit of the modulation frequency range.

The filtered IF signal fi(t) as it is indicated in FIGS. 3 and 4 is a combination of the modulation signal's instantaneous frequency $f_m$ and the IF center frequency $f_{IF}$, or if multiplied by $2\pi$, corresponds to $\omega_m$ and $\omega_{IF}$, respectively.

$$\omega = \omega_m + \omega_{IF} \quad (6)$$

Since the instantaneous phase of this signal is the integral of the angular frequency, which leads to equation (7).

$$\varphi = \int_{\tau=0}^{t} \omega(\tau)d\tau = \int_{\tau=0}^{t} (\omega_m(\tau) + \omega_{IF})d\tau = \int_{\tau=0}^{t} \omega_m(\tau)d\tau + \omega_{IF} \cdot t \quad (7)$$

From time continuous equation (7) can be recognized that the IF center frequency is nothing but an additional ramp in the phase. This is certainly also true in the time discrete system, leading to equation (8).

$$\phi(n \cdot T_s) = \phi_m(n \cdot T_s) + \omega_{IF} \cdot n \cdot T_s \quad (8)$$

Now comes the point where modulo arithmetic can be introduced. Basically, phase is ambiguous with a periodicity of $2\pi$. This is true for the imaginary part of the argument to the complex exponential as well as it is true for the output of the CORDIC block 337 or 437, respectively. Mathematically this property can be written as equation (9).

$$\phi = \phi + m \cdot 2\pi (\text{mod } 2\pi) \quad (9)$$

wherein m is an arbitrary integer number.

In time discrete systems, this has the following implication:

$$\varphi(n \cdot T_s) = \varphi(n \cdot T_s) + m \cdot 2\pi \quad (10)$$
$$= \varphi(n \cdot T_s) + k \cdot \frac{n \cdot T_s}{T_s} \cdot 2\pi \ (\text{mod} 2\pi)$$

$$\varphi(n \cdot T_s) = \varphi(n \cdot T_s) + k \cdot f_s \cdot n \cdot T_s \cdot 2\pi \quad (11)$$
$$= \varphi(n \cdot T_s) + k \cdot \omega_s \cdot n \cdot T_s \ (\text{mod} 2\pi)$$

wherein k is another arbitrary integer number.

According to Equation (11), any ramp ($k \cdot \omega_s \omega t$) may be added to the phase of the signal without noticing any difference. However, adding such a phase ramp means that the frequency of the signal is shifted by ($k \cdot \omega_s$). This is perfectly in line with the findings above, which said that the spectra of time discrete signals may be interpreted as periodic with a period of $\omega_s$.

Now equations (11) and (8) can be put together in order to combine the modulation, the IF frequency and the sampling frequency, which leads to equation (12).

$$\phi(n \cdot T_s) = \phi_m(n \cdot T_s) + \omega_{IF} \cdot n \cdot T_s + k \cdot \omega_s \cdot n \cdot T_s (\text{mod } 2\pi) \quad (12)$$

Now, the average frequency can be computed for each sampling interval from equation (12), which can be put into equation (3) leading after some simplifications to equation (13).

$$\overline{\omega}(n \cdot T_s) = \frac{\varphi_m(n \cdot T_s) - \varphi_m((n-1) \cdot T_s)}{T_s} + \omega_{IF} + k \cdot \omega_s \ (\text{mod}\,\omega_s) \quad (13)$$

It is noted that the modulus in the equation (13) has changed, due to the division by sampling interval duration $T_s$. Finally, substituting the symbol for the average modulation frequency per sampling interval results in equation (14).

$$\overline{\omega}(n \cdot T_s) = \overline{\omega}_m(n \cdot T_s) + \omega_{IF} + k \cdot \omega_s (\text{mod}\,\omega_s) \quad (14)$$

Now, it can be seen that according to the invention for de-rotation of the signal to zero IF, advantageously a subtraction of the IF frequency from this result is necessary as expressed by equation (15).

$$\begin{aligned}\overline{\omega}_{res}(n \cdot T_s) &= \overline{\omega}(n \cdot T_s) - \omega_{IF} \quad (15)\\ &= \overline{\omega}_m(n \cdot T_s) + \omega_{IF} - \omega_{IF} + k \cdot \omega_s \ (\text{mod}\,\omega_s)\\ &= \overline{\omega}_m(n \cdot T_s) + k \cdot \omega_s \ (\text{mod}\,\omega_s)\end{aligned}$$

Now, if the output is restricted to the initially defined interval, the integer number k becomes zero and the final result may be expressed by equation (16).

$$\omega_{lo} \leq \overline{\omega}_{res} < \omega_{lo} + \omega_s$$

$$\overline{\omega}_{res}(n \cdot T_s) = \overline{\omega}_m(n \cdot T_s) + 0 \cdot \omega_s = \overline{\omega}_m(n \cdot T_s) \quad (16)$$

That is, the demodulation process retrieves the modulation signal unambiguously.

In a practical implementation of the invention the output of the CORDIC block 337 or 437, respectively, is N bits wide and the output number range 0 to $2^N-1$ corresponds directly to the range $0 \leq \phi < 2\pi$. It is noted that eventually an offset may be included. When doing so the phase wrapping corresponds directly to the wrapping of the output integer range. Further, for implementation of equation (3), which computes the average frequency per interval, the dividing through $T_s$ is omitted. Hence, only a simple subtraction of successive phase values from each other has to be carried out. In this subtraction no borrow bit is added in order to achieve again wrapping modulo $2\pi$. It is worth noting that the factor $T_s$ is dropped. Consequently, for the de-rotation $(T_s \cdot \omega_{IF})$ is subtracted, which is truncated to the same number of bits. Finally, yet importantly, to interpret the resulting binary number as modulation frequency, the binary number is multiplied by $(f_s/2^N)$.

The present invention has disclosed a digital receiver for FM signals, in particular a new demodulator structure and respective demodulating method, by which according to a first aspect of the invention the usual complex de-rotation process is reduced to a simple addition/subtraction. According to a second aspect of the invention the requirements for the sampling frequency necessary for processing the demodulator signals are reduced substantially, in particular to a lower value than twice the upper band edge of the IF signal.

Finally but yet importantly, it is noted that the term "comprising" when used in the specification including the claims is intended to specify the presence of stated features, means, steps or components, but does not exclude the presence or addition of one or more other features, means, steps, components or groups thereof. Further, the word "a" or "an" preceding an element in a claim does not exclude the presence of a plurality of such elements. Moreover, any reference sign does not limit the scope of the claims. Furthermore, it is to be noted that "coupled" is to be understood that there is a current path between those elements that are coupled; that is, "coupled" does not mean that those elements are to be directly connected.

The invention claimed is:

1. Demodulator for angle-modulated signals, comprising means for demodulation of an input intermediate frequency angle-modulated signal, and means for de-rotation of said intermediate frequency angle-modulated signal, wherein said means for de-rotation are placed after said demodulation means in order to receive an output signal of the demodulation means and to perform a frequency conversion into a base band and are configured such that de-rotation consists of an addition or subtraction operation.

2. Demodulator according to claim 1, further comprising a harmonic signal filter for filtering harmonics of said input intermediate frequency angle-modulated signal to be demodulated wherein said harmonic signal filter is placed before said demodulation means.

3. Demodulator according to claim 2, further comprising signal limiting means placed before said harmonic signal filter and said harmonic signal filter being configured to cancel all harmonics of the intermediate demodulation signal caused by said signal limiting means.

4. Demodulator according to claim 1, wherein said means for de-rotation consist of a subtraction or an addition of a constant value, said constant value corresponding to a center frequency of the filtered intermediate frequency demodulation signal.

5. Demodulator according to claim 1, wherein at least said demodulation means and said means for de-rotation are implemented as a time discrete system, in which a sampling frequency for sampling of said intermediate frequency angle-modulated signal corresponds substantially to the two-sided bandwidth of said filtered intermediate frequency demodulation signal.

6. Demodulator according to claim 5, wherein the sampling frequency is smaller than the center frequency of the filtered intermediate frequency demodulation signal.

7. Demodulator according to claim 5, wherein said subtraction or addition of said de-rotation means is carried out modulo said sampling frequency.

8. Demodulator according to claim 5, wherein said demodulation means comprises a coordinate digital computer and a differentiator.

9. FM receiver for receiving frequency modulated signals, which is at least implemented partly in digital circuitry, comprising a demodulator according to claim 1.

10. The demodulator of claim 1, wherein said means for de-rotation are configured such that the spectrum of the input intermediate frequency angle-modulated signal is shifted by a value of an intermediate frequency of the input intermediate frequency angle-modulated signal to zero intermediate frequency.

11. Method for demodulating an intermediate frequency angle-modulated signal, comprising at least the steps of:
converting said intermediate frequency angle-modulated signal to an instantaneous phase signal;
differentiating said instantaneous phase signal to an instantaneous angular frequency signal; and
de-rotating said instantaneous angular frequency signal by subtraction of a value corresponding to a center frequency of said intermediate frequency angle-modulated signal in order to perform a frequency conversion to a base band.

12. Method according to claim 11, further comprising the step of filtering said intermediate frequency angle-modulated signal such that all higher harmonics of said intermediate frequency angle-modulated signal are cancelled.

13. A non-transitory computer program product comprising a non-transitory computer-readable medium storing code means readable by a digital computer, wherein said code means are coded such that when run on said digital computer, said computer is configured such that to perform a method for demodulating an intermediate frequency angle-modulated signal according to claim 11.

14. A digital computer for executing a computer program product comprising code means, wherein said code means are coded such that when run on said digital computer, said computer is configured such that to perform a method for demodulating an intermediate frequency angle-modulated signal according to claim 11.

15. The method of claim 11, wherein de-rotating said instantaneous angular frequency signal includes de-rotating said instantaneous angular frequency signal such that the spectrum of the input intermediate frequency angle-modulated signal is shifted by a value of an intermediate frequency of the input intermediate frequency angle-modulated signal to zero intermediate frequency.

16. A demodulator comprising:
a demodulation processor configured to demodulate an input intermediate frequency angle-modulated signal; and
a de-rotation block configured to de-rotate said intermediate frequency angle-modulated signal,
wherein said de-rotation block is placed after said demodulation processor in order to receive an output signal of the demodulation means and to perform a frequency conversion into a base band and is configured such that de-rotation consists of an addition or subtraction operation.

* * * * *